United States Patent [19]

Huang et al.

[11] Patent Number: 5,572,147
[45] Date of Patent: Nov. 5, 1996

[54] POWER SUPPLY VOLTAGE DETECTOR

[75] Inventors: Heng-Sheng Huang, Taipei; Kun-Lun Chen, Hsinchu; Te-Sun Wu, Hsinchu Hsien, all of Taiwan

[73] Assignee: United Microelectronics Corporation, Hsinchu, Taiwan

[21] Appl. No.: 525,060

[22] Filed: Sep. 8, 1995

[51] Int. Cl.$^6$ .................. H03K 19/0948; H03K 5/153
[52] U.S. Cl. ................. 326/33; 326/32; 326/83; 326/81; 327/78; 327/81
[58] Field of Search .............. 326/31–34, 80–81, 326/83, 86, 121, 17; 327/77–78, 80–81, 85, 333, 535, 537

[56] References Cited

U.S. PATENT DOCUMENTS

| | | | |
|---|---|---|---|
| 4,024,415 | 5/1977 | Matsuura | 327/81 |
| 4,122,360 | 10/1978 | Kawagai et al. | 326/121 |
| 4,578,600 | 3/1986 | Magee | 326/34 |
| 5,373,199 | 12/1994 | Shichinohe | 326/17 |
| 5,406,141 | 4/1995 | Yero et al. | 326/83 |

Primary Examiner—Edward P. Westin
Assistant Examiner—Jon Santamauro
Attorney, Agent, or Firm—Cushman Darby & Cushman, L.L.P.

[57] ABSTRACT

A voltage detector for determining the high or low status of a power supply output voltage, including a front-end detector and an inverting amplifier. The front-end detector includes a number of NMOS and PMOS transistors which constitute active loads. The voltage detector is inherently independent of device fabrication condition changes, as well as on the temperature variations.

10 Claims, 4 Drawing Sheets

POWER SUPPLY VOLTAGE DETECTOR

BACKGROUND OF THE INVENTION

1. Field of the Invention

The present invention relates in general to voltage detectors. In particular, the present invention relates to a source voltage detector logic circuit having smaller temperature dependency and reverse drift effects than those of conventional circuits in the critical threshold voltages of the constituting NMOS and PMOS transistors thereof for stable voltage detection operation.

2. Description of Related Art

Voltage detectors are widely utilized in digital electronic circuits. The result of voltage detection provides the basis on which to determine whether or not to initiate a particular system logic function. In a microprocessor-based computer system, for example, a source voltage detector is utilized to detect the voltage level of the power supply voltage in its memory subsystem. The voltage detector provides a signal to auxiliary circuitry that controls the power supply voltage to the memory blocks of the computer system.

The majority of the desktop personal computer systems still employ 3-volt logic circuits. Recently, however, there has been a trend, at least among microprocessors used as CPUs in desktop computers, toward the use of 3-volt logic. The purpose of the reduced voltage is to diminish thermal dissipation and save power. However, the rest of the computer system (other than the microprocessor and its associated circuitry) still requires the more popular 5-volt power supply. In the case of desktop computer systems, this is particularly true. The vast majority of peripheral devices, including those on boards that plug into computer expansion slots, operate on 5-volts.

The change to the 3-volt design is, therefore, much restricted in these desktop systems, at least when compared to the other sector of the microprocessor-based personal computer industry, that is, the portable computers, or, the notebook computers, as they are more frequently referred to.

Among the most important design considerations for portable computers is the extension of battery life. Power management techniques have been developed and are beneficial. However, further extension of battery life can be obtained simply by reducing operating voltages for the entire computer. The reduction of the power supply voltage not only reduces the power consumption rate, but also reduces the heat dissipation that, in the much confined cabinet environment such as in a notebook computer, if not carefully handled, may easily restrict the usefulness of the notebook computer.

Thus, a trend is developing in the adoption of lower voltage levels. A voltage level of 3 volts seems to be the standard to which more and more manufactures are adhering. Of course, there are many computer systems operating at 5-volts that have considerable useful life remaining. Therefore, the various computer components must remain 5-volt compatible during a transitional period from a 5-volt standard to a 3-volt standard.

In view of this, many digital components for the personal computer systems are now designed to be operated at either 5 or 3 volts. For example, SRAM devices are frequently utilized as the building blocks for secondary cache memory subsystems of modern high-speed microprocessor-based personal computer systems. They are therefore among the first components that should be adapted to operate at either 5 or 3 volts. This is because in many low-cost computer system designs, the data bus of the SRAM-based secondary cache memory subsystem is directly tied to the data bus of the CPU. There is a similar situation in DRAM devices when they are installed in these 3-volt computer systems.

For the SRAM devices to be able to adapt to both the 5- and 3-volt operating modes, a voltage detector is integrated into the SRAM memory subsystems to detect the system power supply voltage, so that the detected result can be employed as the basis for a determination concerning either the higher 5-volt or the lower 3-volt power should be supplied. With this power supply detection, as well as the adjustment capability present in the computer systems, SRAM manufacturers will not be required to make two different types of SRAM devices, one for 3- and one for 5-volt systems. However, in the conventional notebook computer system designs, the supply voltage detection circuitry, as well as the necessary power supply adjustment circuitry, both constitute a complication to the overall logic system of the entire notebook computer. The following is a brief description of those conventional circuits.

FIG. 1 (Prior Art) is a schematic diagram of the logic circuitry of a conventional voltage detector. The front-end detector 3 of the conventional voltage detector comprises a PMOS transistor MP1 connected in series with an NMOS transistor MN1. The gate and source terminals of both the PMOS transistor MP1 and the NMOS transistor MN1 are tied together and then connected together to constitute an upper load element. The output voltage at the drain of the NMOS transistor MN1, as designated by $V_1$, may be determined by $$V_1 = V_{CC} - |V_{TP1}| - |V_{TM1}|$$

wherein $V_{TP1}$ and $V_{TM1}$ are the threshold voltages of the transistors MP1 and MN1 respectively. Another NMOS transistor MN2 has its gate terminal tied to the series connection joint of the transistors MN1 and MP1 and its drain terminal connected to the source of the transistor MN1, while its source terminal is connected to the system ground plane. This prevents the floating of the upper load element consisting of the transistors MP1 and MN1, and allows the output voltage $V_1$ to be pulled up substantially to the $V_{CC}$ potential.

The output voltage of this conventional basic front-end detector 3, namely, voltage $V_1$, is coupled to the input of a logic inverter INV1 connected as the succeeding stage that takes up $V_1$ as input as either a logical high, or a logical low signal. The logical high/low status of this voltage $V_1$ is generally determined by parameters including the power supply voltage $V_{CC}$, as well as the width/length ratio (W/L ratio) of the channel regions of the NMOS and PMOS transistors that constitute the inverter INV1. A further inverter stage INV2 may be coupled to the output of inverter INV1, the output of inverter INV2 being designated as $V_S$.

FIG. 2 (Prior Art) is a schematic diagram of logic inverter INV1 utilized in the conventional voltage detector shown in FIG. 1 (Prior Art). The conventional CMOS inverter comprises a pair of PMOS and NMOS transistors MP2 and MN3 respectively. When the power supply voltage $V_{CC}$ is smaller than 3.3 V, $V_1$ may be smaller than 1 volt. In this case, if the input transition point for this CMOS inverter INV1 is at ⅓ $V_{CC}$, then $V_1$ would be regarded as the logical low signal. On the other hand, when the power supply voltage $V_{CC}$ is higher than 4.5 V, the input signal $V_1$ to this inverter would be higher than 1.9 V, which would be larger than ⅓ $V_{CC}$, and would therefore be regarded as a logical high signal.

Thus, with the variation in the power supply voltage, the inverter INV1 would be able to interpret the input signal $V_1$ to its input as either a logical low or high input signal, depending on the range of the power supply voltage $V_{CC}$ in the range covering 3.3 to 4.5 V. The CMOS inverter INV1 would therefore be able to output a logical high or low signal accordingly, which can be utilized as the trigger signal for an auxiliary circuitry that can actually control the power supply circuitry to provide the power source at the appropriate voltage.

However, due to the inherent nature of the semiconductor devices that are subject to the changes of controlling conditions during fabrication, electronic characteristics of the semiconductor integrated circuits drift with respect to the intended nominal value. In other words, the threshold voltages $V_{TP}$ and $V_{TN}$ for PMOS and NMOS transistors respectively would either be relatively higher and lower, or be relatively lower and higher respectively, depending on the conditions of device fabrication involved. The result is the drift of the output voltage of the inverter INV1. On the other hand, the ambient temperature conditions will also affect the threshold voltages of the PMOS and NMOS transistor devices. Normally, the higher the ambient temperature, the lower the threshold voltages $V_{TP}$ and $V_{TN}$ become. This also changes the logical transition point of the inverter, resulting in a larger range of the logical transition point for the inverter. This point is illustrated by two graphs.

FIG. 3a (Prior Art) is a characteristics curve showing the output voltage $V_3$ of inverter INV1 versus the power supply voltage $V_{CC}$ of the conventional voltage detector arrangement shown in FIG. 1 (Prior Art). The three different characteristic curves depicted in the drawing represent three possibly different curves depending on the conditions that existed during device fabrication and on device operating temperature. There are, of course many other possible characteristic curves. Only three are shown for simplicity. The alternative characteristic curves are schematically indicated by the left and right phantom lines.

FIG. 3b (Prior Art) is a characteristic curve showing the relationship of output voltage $V_5$ of inverter INV2 shown in FIG. 1 (Prior Art). The direct result of this phenomena of drifting logical transition point of a conventional CMO3 inverter, such as inverter INV1 depicted in FIG. 2 (Prior Art), is the corresponding drifting of the output voltage $V_5$ of inverter INV2. This drifting manifests itself as a drifting of the power supply voltage transition value $V_{TR}$, as outlined by the left and right phantom lines in FIG. 3b (Prior Art). Such characteristics drifting phenomena severely confines the useful range of operating conditions. In other words, in a system with larger characteristic drifting effect, the operating temperature range is smaller, and the system must be restricted to the operation of limited speed range.

SUMMARY OF THE INVENTION

It is therefore an object of the present invention to provide a voltage detector that has logical transition point characteristics that are less dependent on fabrication conditions.

It is another object of the present invention to provide a voltage detector that has logical transition point characteristics that are less dependent on operating temperature changes.

The present invention achieves these objectives by providing a new voltage detector arrangement that is suitable for use in determining the high or low status of the output voltage of a power supply device. The power supply voltage detector comprises a front-end detector and an inverting amplifier. The front-end detector has a first load element and a pull-down element. The front-end detector receives the power supply voltage at the load element and is coupled to the pull-down element for outputting the detected result at a front-end output node. The pull-down element is tied to system ground. The inverting amplifier includes a second load element, an inverter, and a third load element. The inverting amplifier is coupled to the front-end detector output node via the inverter for inputting the detected result of the front-end detector, and outputs the generated detection result signal at an output node of a coupled inverter. The second load element is coupled to the inverter for receiving the power supply voltage output, and acts as the upper load for the inverter. The third load element is coupled to the inverter and tied to system ground for providing the lower load. Each of the load elements comprises a pair of PMOS and NMOS transistors, the gate and drain terminals of which are connected together, forming an active load element with the source terminal of the PMOS transistor forming one node of the active load element, and the source terminal of the NMOS transistor forming the other node of the active load element. The inverter comprises at least one NMOS transistor and one PMOS transistor, wherein the gate terminals of the NMOS and PMOS transistors are coupled together and connected to the output of the front-end detector. The drain terminals of the NMOS and PMOS transistors are coupled together to form the output of the inverter. The voltage detector is characterized by its inherent independence on the device fabrication condition changes, as well as on the temperature variations.

BRIEF DESCRIPTION OF THE DRAWINGS

Other objects, features and advantages of the present invention will become apparent by way of the following detailed description of the preferred but non-limiting embodiment. The description is made with reference to the accompanied drawings, wherein:

FIG. 5b is a schematic diagram of the preferred inverter for the voltage detector of FIG. 5a;

FIG. 5c is a schematic diagram of the preferred inverting amplifier for the voltage detector of FIG. 5a;

FIG. 6b is a characteristic curve showing the output voltage versus the power supplying voltage of an inverting amplifier downstream of the amplifier depicted in FIG. 6a.

DETAILED DESCRIPTION OF THE PREFERRED EMBODIMENTS

Figure 4:
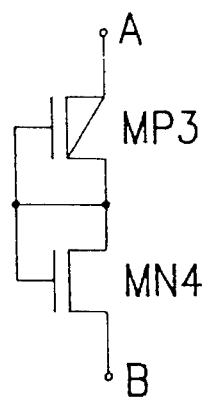
FIG. 4 is a schematic diagram of an active load circuit used as a building block in the present invention.

FIG. 4 is a schematic diagram of an active load circuit which is an important building block in the present invention. The active load circuit includes a pair of transistors including a PMOS transistor MP3 and an NMOS transistors MN4. The gates and drains of both transistors are coupled together. The source terminal of transistor MP3 is marked node A and the source terminal of transistor MN4 is marked node B. In order for the load element to conduct, i.e. to have both of the transistors go into conduction, an electrical potential applied between nodes A and B must be greater than the sum of the absolute threshold voltages of the two transistors. The output of this active load circuit is independent of relative drift larger or smaller of the threshold voltages of transistors MP3 and MN4.

Figure 5A:
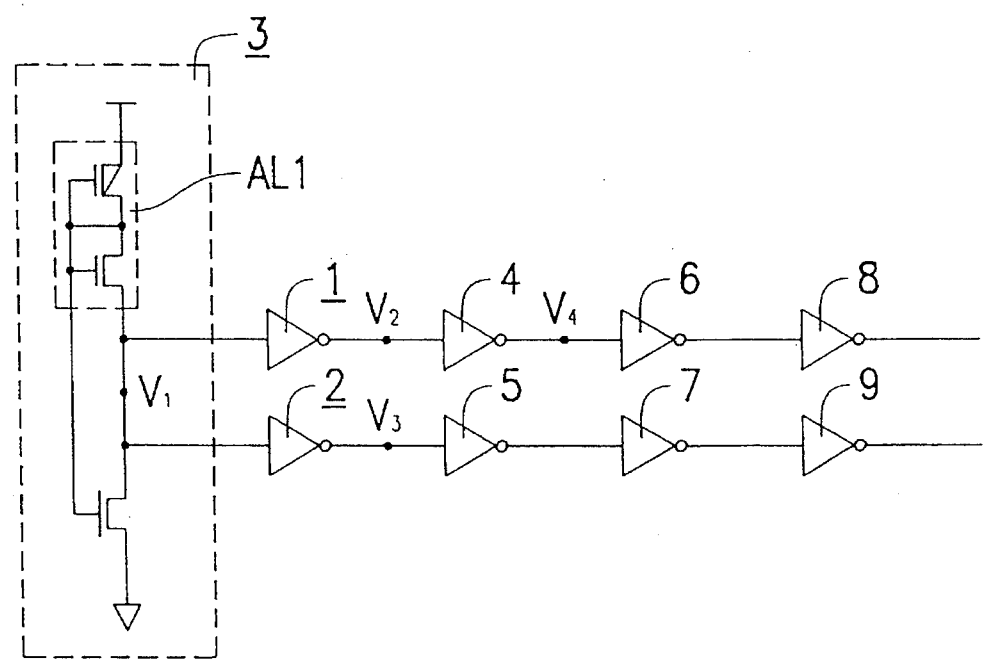
FIG. 5a is a schematic diagram of the logic circuitry of the voltage detector in accordance with a preferred embodiment of the present invention.

FIG. 5a is a schematic diagram of the logic circuitry of the voltage detector in accordance with a preferred embodiment of the present invention. The voltage detector comprises a front and detector 3, which includes an active load circuit as shown in FIG. 4. The output of front end detector 3 is coupled to inverting amplifiers 1 and 2. The output of inverting amplifier 1 is coupled to a cascade of inverters 4, 6 and 8. The output of inverting amplifier 2 is coupled to a cascade of inverters 5, 7 and 9.

Figure 5B:
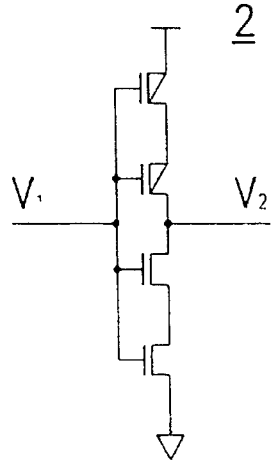

FIG. 5b is a schematic diagram of an inverter, such as inverter 2 (see FIG. 5a). There are four active elements, arranged as shown. Input $V_1$ is inverted to an output $V_3$.

Figure 5C:
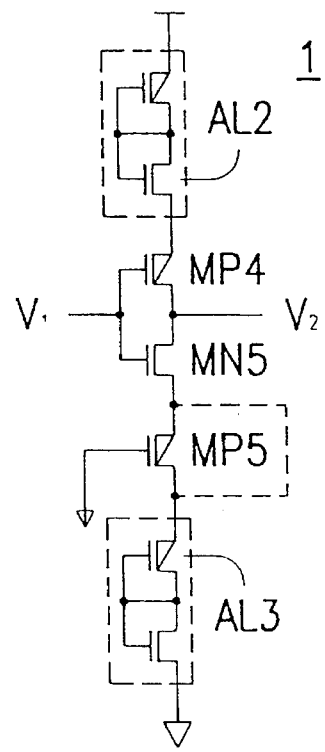

FIG. 5c is a schematic diagram of the preferred inverting amplifier 1 for the voltage detector of FIG. 5a. The active load element as shown in FIG. 4 is utilized as a building block for the inverting amplifier 1 (see AL2 and AL3 in FIG. 5c). This active load element is also used as a substitute for a conventional CMOS inverter 2 as shown in FIG. 5b.

Inverting amplifier 1 is a CMOS inverter-based device that comprises active load elements AL2 and AL3, a PMOS transistor MP4, an NMOS transistor MN5, and a PMOS transistor MP5 that is utilized as the temperature compensation device for the voltage detector discussed herein. PMOS transistor MP4 and the NMOS transistor MN5 are connected in series, with their gates tied together, and their drain terminals also tied together. The common gates of the transistors MP4 and MN5 are the input node to receive the output $V_1$ of the front-end detector 3 (see FIG. 5a). The common drains, on the other hand, constitute the output for the inverting amplifier 1 that produces the output voltage $V_2$ (see FIG. 5a). The source of the PMOS transistor MP4 is connected to one end of the active load element AL2, and the other end of the active load element AL2 is then tied to the power supply voltage $V_{CC}$ of the system, as when the entire inverting amplifier 1 is utilized in the voltage detector of FIG. 5a.

The source terminal of the NMOS transistor MN5 is connected to the PMOS transistor MP5 that serves as the temperature compensation element for the detector before being connected to another active load element AL3. The active load element AL3 has one end connected to the temperature-compensating PMOS transistor MP5, and has its other end tied to the system ground, when the inverting amplifier 1 is utilized as the inverter for the front-end detector 3. The active load element AL2 of the inverting amplifier 1 pulls up the input voltage $V_1$, while the other active load element AL3 pulls down the voltage $V_1$.

With reference directed again to FIG. 5a, it is observed that the front-end detector 3 of the preferred embodiment of the present invention is of a similar basic arrangement as that of the conventional detector. However, there is a significant difference. The pulling-up load is an active load element AL1 according to the present invention.

The physical semiconductor dimensions of the PMOS and NMOS transistors constituting the active load elements AL1, AL2, and AL3, as may be appreciated by persons skilled in the art, can be tailored to meet the need for the precise adjustment of the logical transition point of the entire detector.

Figure 1:
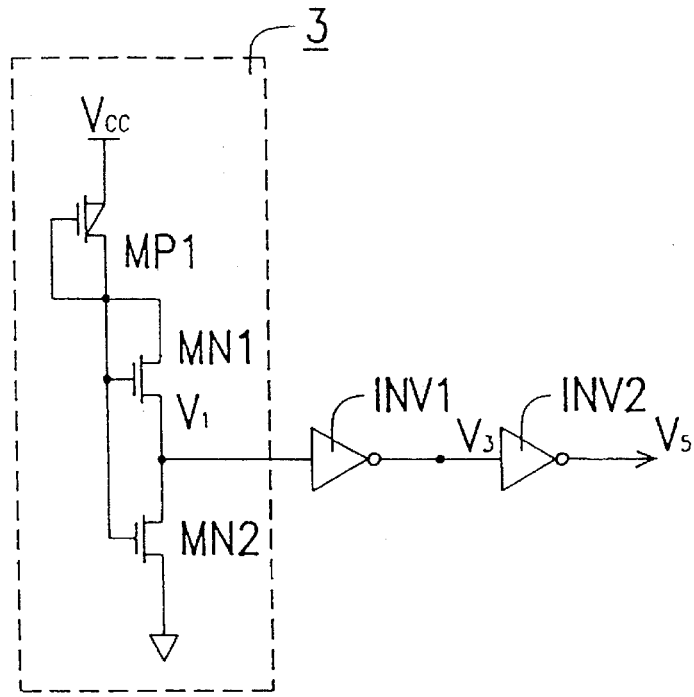
FIG. 1 (Prior Art) is a schematic diagram of the logic circuitry of a conventional voltage detector.
Figure 2:
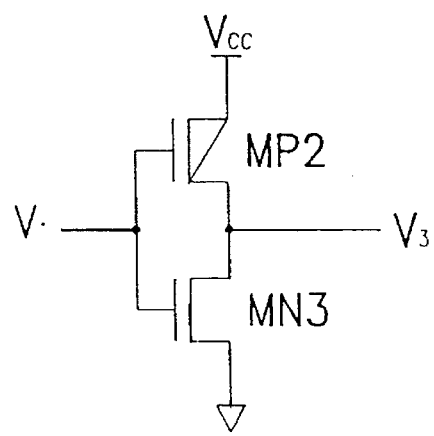
FIG. 2 (Prior Art) is a schematic diagram of conventional logic inverter INV1 employed in the conventional voltage detector of FIG. 1.
Figure 3A:
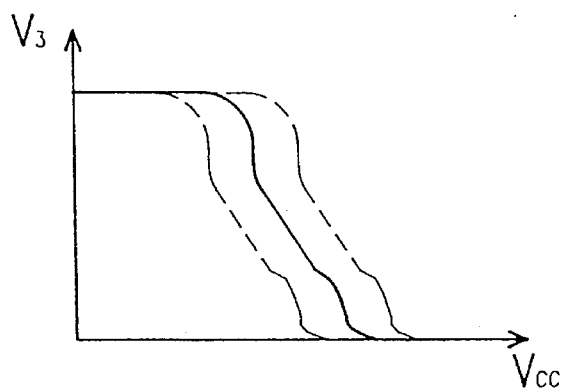
FIG. 3a (Prior Art) shows characteristic curves of the output voltage versus the power supplying voltage of the conventional voltage detector arrangement shown in FIG. 1 (Prior Art)
Figure 3B:
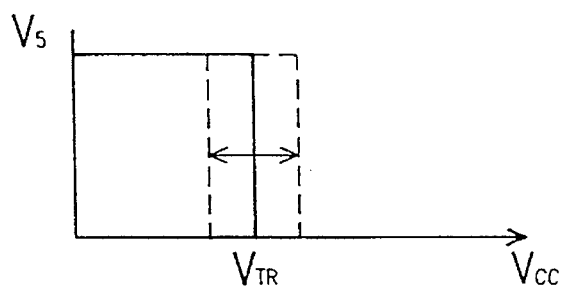
FIG. 3b (Prior Art) shows characteristic curves of a conventional logic inverter (shown schematically in FIG. 2) of the type used in the FIG. 1 (Prior Art) arrangement.
Figure 6A:
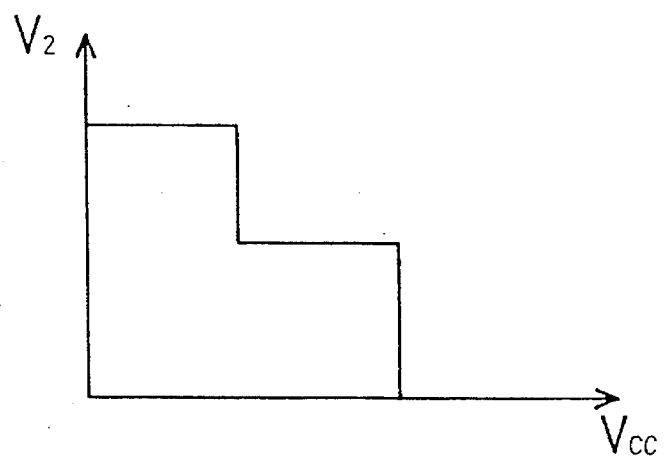
FIG. 6a is a characteristic curve showing the output voltage versus the power supplying voltage as depicted in the selected nodes of the inverting amplifier output.
Figure 6B:
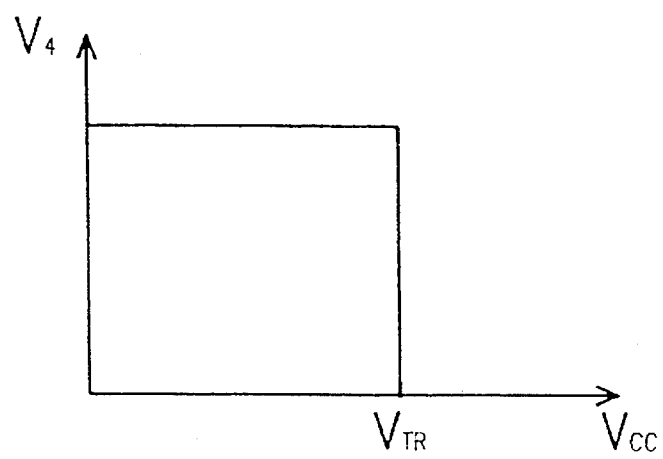

The inverting amplifier 1 of FIG. 5c, when the transistors in its active load elements are tailored to the desired physical dimensions, allows the detector of FIG. 5a to exhibit the $V_2$ characteristics as shown in FIG. 6a. The output voltage $V_2$ as measured at the output node of the inverting amplifier 1, when expressed as the function of the system power supply voltage $V_{CC}$, exhibits a stepped, rather than the gradually changing characteristics curve. This allows the existence of the stepped characteristics curve of the output voltage V4 picked up at the output of a further stage of inverter 4, as is shown in FIG. 6b. The output characteristics of the output node of the inverting amplifier 1 allows the generation of the stepped power supply voltage transition value $V_{TR}$ characteristics curve of FIG. 6b, even if the inverter 4, as well as further cascade of inverters 6 and 8, are the conventional inverters that inherently exhibit the drifting voltage relationship characteristics, such as the one shown in FIG. 3a.

The following description sets forth an example of the adjustment of the logical transition point of the voltage detector of the present invention.

With (WP/LP, WN/LN)$_{ALi}$ representing the channel width/length ratio of the PMOS and NMOS transistors that constitute the active load elements respectively, there is the following relationship for determining the power supply voltage transition value $V_{TR}$ for the voltage detector:

$$V_{TR} = \frac{1+N}{N} (|V_{TN}| + |V_{TP}|)$$

wherein $V_{TN}$ is the NMOS transistor threshold voltage, taking into consideration its body effect, $V_{TP}$ is the PMOS transistor threshold voltage, taking into consideration its body effect, and wherein the physical dimensions of the transistors in the three active load elements AL1, AL2 and AL3 are respectively:

(WP/LP, WN/LN)$_{AL1}$=(16/8, 8/8)
(WP/LP, WN/LN)$_{AL2}$=(16/8, 8/8)
(WP/LP, WN/LN)$_{AL3}$=(16/8, 8/8), (10/8, 5/8), or (20/8, 10/8), which makes the three active load elements to have a dimensional ratio of 1:1:N, wherein N is one of 1, 5/8 and 10/8.

When a semiconductor fabrication resolution of 0.5 m is employed, the absolute values for $V_{TN}$ and $V_{TP}$ are about 2.6 V respectively. Then, $V_{TR}$  5.2V  when $N=1$;
$V_{TR}$  6.6V  when $N=5/8$; and
$V_{TR}$  4.7V  when $N=10/8$.

The above examples show that the logical transition value for the voltage detector logic circuitry may actually be adjusted at will with the corresponding proper adjustment of the semiconductor dimensions. Namely, the three exemplified N values of 1, 5/8 and 10/8 actually result in the logical transition values for the voltage detector of 5.2, 6.6 and 4.7 V respectively.

On the other hand, when the effect of ambient operating temperature is taken into consideration, it can be found that the logical transition value $V_{TR}$ of the voltage detector actually goes down as the temperature goes up, due to the fact that the logical transition value changes in proportion with the threshold voltages. The following table summarizes such changes caused by temperature variation:

|  | W/L | −10° C. | 85° C. | Deviation |
|---|---|---|---|---|
| NMOS transistor | 50/50 | 0.792 | 0.706 | 0.086 |
|  | 50/0.6 | 0.685 | 0.575 | 0.11 |
| PMOS transistor | 50/50 | 0.893 | 0.754 | 0.14 |
|  | 50/0.6 | 0.894 | 0.76 | 0.135 |

As is seen in the table, in the −10° to 85° C. temperature range, there is a deviation of between 10 to 20% for the logical transition value, which, when taken into the consideration of the body effect, averages still around 10%. For example, when N is set to 1, $V_{TR}$ is about 5.2 V 0.25 V. This 0.25 V of deviation is the result of the temperature change, from −10° to 85° C. which is disadvantageous for high speed operations of the voltage detector. This is because that the rise of temperature causes the decrease in the $V_{TR}$ value, which contradicts the expectation that the rise of temperature would correspond to the increase in the $V_{TR}$ value.

The use of the temperature compensation PMOS transistor MP5 is just for the compensation of this reversed drifting of the logical transition value $V_{TR}$ with respect to the change in temperature. The PMOS compensation transistor, which has a relatively narrow and long channel region, has its gate tied to ground. Such narrow and long channel region has the characteristics of increased conduction impedance when the temperature rises. This is because that electrons in the channel region of the PMOS transistor MP5 are less mobile in higher than in lower temperatures. With proper selection of the channel region width/length ratio for the temperature compensation PMOS transistor MP5, the increased conduction impedance at higher temperature of MP5 may just properly compensate for the decrease in the logical transition value $V_{TR}$ of the voltage detector as a direct result of the increased temperature. It is even possible to have the more explicit positive temperature coefficient of the conduction impedance to overwhelm the negative temperature effect on the threshold voltage, so that the entire voltage detector device may exhibit a more ideal positive temperature coefficient.

Thus, the above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims. For example, more than one inverter of the present invention, namely inverters 4–9 comprising active load elements that are made of PMOS/NMOS transistor pairs with different W/L ratio, may be fabricated as cascade at the output of the front-end detector 3, in order to generate various logical transition values suitable for different application purposes. Or, even the conventional inverters 2 such as the one shown in FIG. 5b, with proper adjustment to its physical dimensions, as with the double arrangement of the PMOS and NMOS transistors for increasing the channel region dimensions, may also be incorporated into the inverter cascade to fulfill the needs. Further, the voltage detector of the present invention is sufficiently small and simple, and is suitable to be incorporated into the SRAM devices, so that no external detection and adjustment circuitry is required for the use of the SRAM containing the inventive detector means. In other words, the SRAM devices containing the inventive voltage detector can be directly plugged into either the 5- or 3-volt systems for operation, with no need of detector circuitry in the SRAM subsystem.

We claim:

1. A voltage detector for determining the high or low status of a power supply voltage and generating a detection result signal, the voltage detector comprising:

a front-end detector including:
  a first load element having a first end coupled to the power supply voltage and a second end, and
  a pull-down element having a first end coupled to the second end of the first load element and forming a front-end detector output node therewith, and a second end coupled to power supply ground; and an inverting amplifier including:
  a second load element having a first end coupled to the power supply voltage and a second end,
  an inverter having a first end coupled to the second end of the second load element and a second end, the inverter comprising at least one NMOS transistor and one PMOS transistor, the gate terminals of the transistors being coupled together to form an input of the inverter connected to the output of the front-end detector, the drain terminals of the transistors being coupled together to form the output of the inverter and the inverting amplifier, and
  a third load element having a first end coupled to the second end of the inverter and a second end coupled to power supply ground, the second load element being an upper load for the inverter, and the third load element providing a lower load for the inverter, each of the load elements comprising a pair of PMOS and NMOS transistors, the PMOS and NMOS transistor's gate and drain terminals being connected together, forming an active load element with the source terminal of the PMOS transistor forming one node of the active load element, and the source terminal of the NMOS transistor forming the other node of the active load element.

2. The voltage detector of claim 1, wherein the inverter further comprises a temperature compensator for providing positive temperature drifting effect for the inverter.

3. The voltage detector of claim 1, wherein a logical transition value of the voltage detector is a function of the width/length ratio of channel regions of the PMOS and NMOS transistors constituting load elements.

4. The voltage detector of claim 2, wherein a logical transition value of the voltage detector is a function of the width/length ratio of channel regions of the PMOS and NMOS transistors constituting the load elements.

5. The voltage detector of claim 2, wherein the temperature compensator comprises a PMOS transistor having a source of terminal connected to the inverter, a drain terminal connected to the third load element, and a gate terminal connected to power supply ground.

6. The voltage detector of claim 4, wherein the temperature compensator is a PMOS transistor having a source terminal connected to the inverter, a drain terminal connected to the third load element, and a gate terminal connected to power supply ground.

7. The voltage detector of claim 5, further comprising a plurality of inverting amplifiers having the channel region width/length ratio of the constituting MOS transistors dissimilar to the width/length ratio of the MOS transistors constituting the third load element, the plurality of inverting amplifiers being connected in cascade and coupled to the output of the front-end detector for providing a plurality of selectable logical transition values at each output node of the cascaded inverting amplifiers.

8. The voltage detector of claim 6, further comprising a plurality of inverting amplifiers having the channel region width/length ratio of the constituting MOS transistors dissimilar to the width/length ratio of the MOS transistors constituting the third load element, the plurality of inverting amplifiers being connected in cascade and coupled to the output of the front-end detector for providing a plurality of selectable logical transition values at each output node of the cascaded inverting amplifiers.

9. The voltage detector of claim 7, wherein the width/length ratio of the PMOS and NMOS transistors comprising the first, second and third load elements are:

16/8 and 8/8 for the PMOS and NMOS transistors respectively for the first load element;

16/8 and 8/8 for the PMOS and NMOS transistors respectively for the second load element; and 16/8 and 8/8, 10/8 and 5/8, or 20/8 and 10/8 for the PMOS and NMOS transistors respectively for the third load element.

10. The voltage detector of claim 8, wherein the width/length ratio of the PMOS and NMOS transistors comprising the first, second and third load elements are:

16/8 and 8/8 for the PMOS and NMOS transistors respectively for the first load element;

16/8 and 8/8 for the PMOS and NMOS transistors respectively for the second load element; and 16/8 and 8/8, 10/8 and 5/8, or 10/8 for the PMOS and NMOS transistors respectively for the third load element.

* * * * *